United States Patent [19]

Isozaki

[11] Patent Number: 5,292,687
[45] Date of Patent: Mar. 8, 1994

[54] PROCESS FOR LAY-OUT OF A SEMICONDUCTOR INTEGRATED CIRCUIT
[75] Inventor: Tomoaki Isozaki, Tokyo, Japan
[73] Assignee: NEC Corporation, Tokyo, Japan
[21] Appl. No.: 832,331
[22] Filed: Feb. 7, 1992
[30] Foreign Application Priority Data
  Feb. 8, 1991 [JP] Japan ................... 3-017807
[51] Int. Cl.⁵ ......................................... H01L 21/60
[52] U.S. Cl. .................... 437/209; 437/206; 437/207; 437/219; 364/491
[58] Field of Search ............... 437/209, 206, 207, 219, 437/217; 364/491

[56] References Cited

U.S. PATENT DOCUMENTS

| 4,268,848 | 5/1981 | Casey et al. | 437/219 |
| 4,577,276 | 3/1986 | Dunlop et al. | 364/491 |
| 4,600,995 | 7/1986 | Kinoshita | 364/491 |
| 4,839,820 | 6/1989 | Kinoshita et al. | 364/491 |
| 4,852,016 | 7/1989 | McGehee | 364/491 |
| 5,079,834 | 1/1992 | Itagaki et al. | 364/491 |
| 5,146,300 | 9/1992 | Hamamoto | 437/919 |

FOREIGN PATENT DOCUMENTS 2-208956  8/1990  Japan ..................... 364/491

Primary Examiner—Tom Thomas
Assistant Examiner—Kevin M. Picardat
Attorney, Agent, or Firm—Burns, Doane, Swecker & Mathis

[57] ABSTRACT

A pad is provided outside a pad block. The most appropriate position is determined for the pad which is connected to the pad block. The pad block is arranged to be most appropriate in position relative to the pad, and a coordinate of the pad block is determined to be used for interconnection of internal regions of the pad block.

6 Claims, 4 Drawing Sheets

5,292,687

PROCESS FOR LAY-OUT OF A SEMICONDUCTOR INTEGRATED CIRCUIT

FIELD OF THE INVENTION

The invention relates to a process for lay-out of a semiconductor integrated circuit, and more particularly to, an automatic lay-out process for designing pad peripheral portions.

BACKGROUND OF THE INVENTION

Conventionally, various CAD tools, automatic design methods, etc. have been proposed on the mask pattern design of semiconductor integrated circuits. Especially, the design using an automatic lay-out tool is a main stream in the mask pattern design of semiconductor integrated circuits which are applied to a specific use called "ASIC", because the semiconductor integrated circuits are required to be delivered to customers in a short term.

A conventional automatic design process includes steps of sampling coordinates of the most appropriate positions for pads, determining an arrangement of pad blocks each including a pad, a transistor region and a logic circuit region, determining an arrangement of a pad, a transistor region, and a logic circuit region in each pad block, and interconnecting the pad, the transistor region, and the logic circuit region. In the pad block, the pad is connected to an inner lead of a lead frame, and to the transistor region including N and P channel transistors for providing an output buffer circuit which is driven by the logic circuit region, and the transistor and logic circuit regions are provided with power supply terminals and ground terminals.

In the coordinate sampling step, a coordinate of the most appropriate pad position is determined in consideration of a lead frame and a chip size. In the next step, a pad block is arranged, such that a center coordinate of a pad is coincided with the determined coordinate. Then, automatic arrangement and interconnection of the internal regions are carried out in each pad block in accordance with coordinates of a pad block which is arranged at the preceding step.

However, the conventional automatic design process has a disadvantage in that a pad can not be provided at a corner region of a semiconductor chip having an area smaller than that for accommodating a designed pad block, because a pad is designed to be positioned in a pad block. In such a case, a pad which is positioned in a pad block is manually shifted to the corner region of the semiconductor chip under the condition that the pad block is provided proximate to the corner region, and interconnection is completed among the internal regions of the pad block, and the shifted pad is manually connected to the original pad block.

SUMMARY OF THE INVENTION

Accordingly, it is an object of the invention to provide a process for lay-out of a semiconductor integrated circuit, by which a pad can be provided at a corner or limited space region of an integrated circuit chip without the manual modification of a pad position and a pad interconnection.

According to the invention, a process for lay-out of a semiconductor integrated circuit, comprises:

determining a coordinate of a pad position which is most appropriate in accordance with a lead frame for packaging the semiconductor integrated circuit and a chip size of the semiconductor integrated circuit;

arranging a pad at the coordinate;

connecting the pad to a pad block, the pad block being positioned to be most appropriate relative to the pad;

determining a coordinate of the pad block; and connecting internal regions of the pad block in accordance with the coordinate of said pad block.

BRIEF DESCRIPTION OF THE DRAWINGS

The invention will be described in more detail in conjunction with appended drawings, wherein.

DESCRIPTION OF THE PREFERRED EMBODIMENT

Before explaining a process for lay-out of a semiconductor integrated circuit of a preferred embodiment according to the invention, the aforementioned conventional automatic design process will be explained in more detail in FIGS. 1 to 4.

Figure 1:
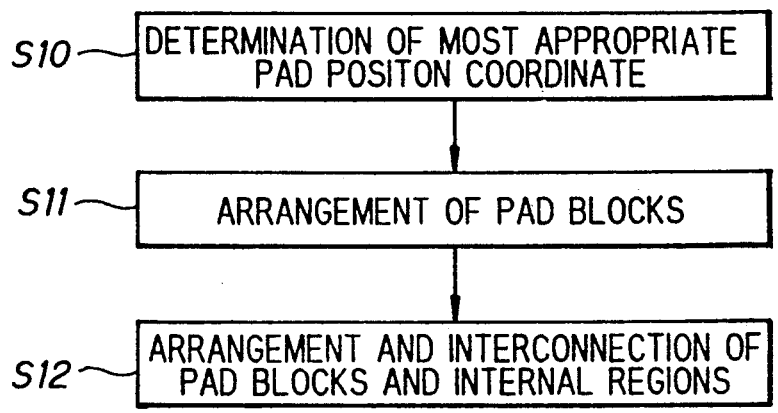
FIG. 1 is a flow chart explaining a conventional automatic design process of a semiconductor integrated circuit.

FIG. 1 shows the conventional automatic design process which comprises steps of sampling coordinates of the most appropriate positions for pads (step "S10"), determining an arrangement of pad blocks (step "S11"), determining an arrangement of internal regions in each pad block which are interconnected in a predetermined interconnection pattern (step "S12").

Figure 2:
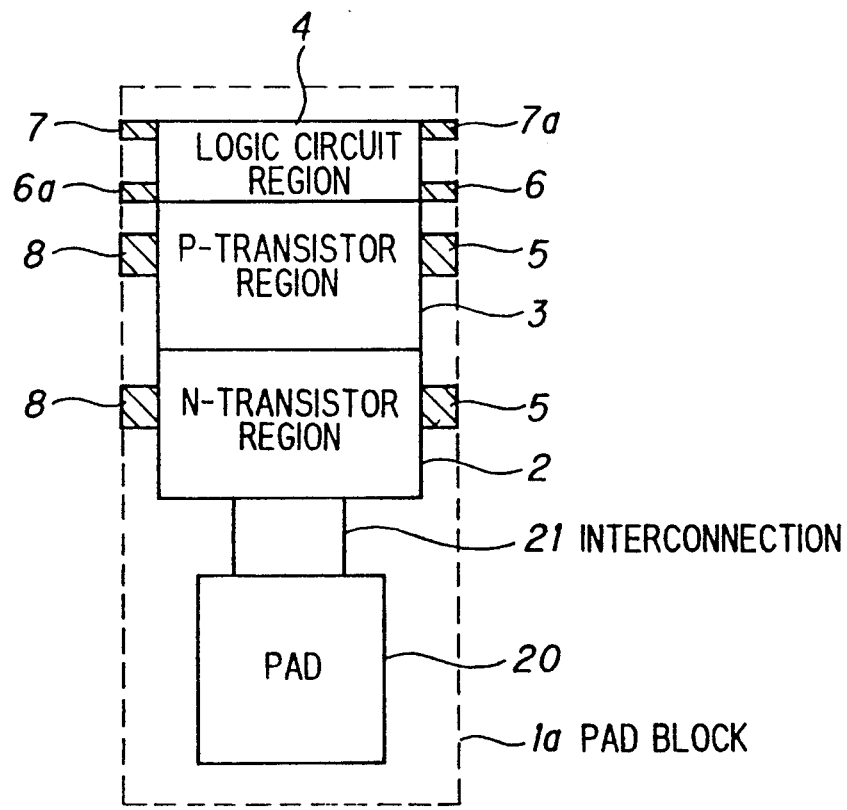
FIG. 2 is a plan view showing a pad block in the conventional automatic design process of a semiconductor integrated circuit.

FIG. 2 shows a pad block 1a which comprises an N channel transistor region 2 and a P channel transistor region 3 for providing an output buffer circuit, a logic circuit region 4 for driving the transistor regions 2 and 3, a pad to be connected to an inner lead 20 of a lead frame (not shown), an interconnection 21 for connecting the pad 20 to the output buffer circuit of the transistor regions 2 and 3, wherein this pad block 1a is connected to adjacent pad blocks by ground terminals 5, 6 and 6a, and power supply terminals 7, 7a and 8.

In the conventional automatic design process, a coordinate of the most appropriate pad position is determined by considering pattern and size of the load frame and a semiconductor chip including this pad block 1a (step "S10"). Next, the pad block 1a is arranged to provide the coincidence between the determined coordinate and a center coordinate of the pad 20 included in this pad block 1a (step "S11"). Finally, automatic arrangement and interconnection of the internal regions of the pad block 1a are carried out without changing the position of the pad block 1a (step "S12"). Consequently, a mask pattern which meets the position requirements of the pad 20 applied to a step of packaging the semiconductor chip is obtained by using an automatic lay-out tool.

Figure 3:
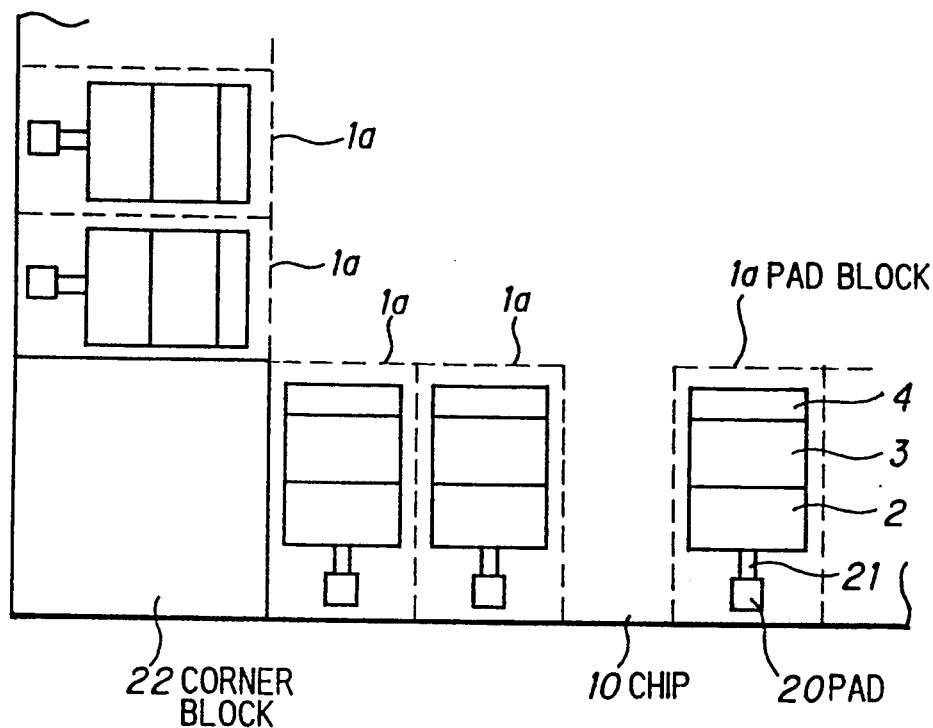
FIG. 3 is an explanatory view showing a lay-out of pad blocks designed in the conventional automatic design process of a semiconductor integrated circuit.

FIG. 3 shows a lay-out of the pad blocks 1a of the semiconductor chip 10 which is designed by the conventional automatic design process. This chip 10 comprises pad blocks 1a arranged along vertical and horizontal sides of the chip 1a to provide a resultant corner block 22. After the arrangement of the pad blocks 1a, interconnection is carried out between internal regions of each pad block 1a and two adjacent pad block 1a by using an automatic lay-out tool.

Figure 4:
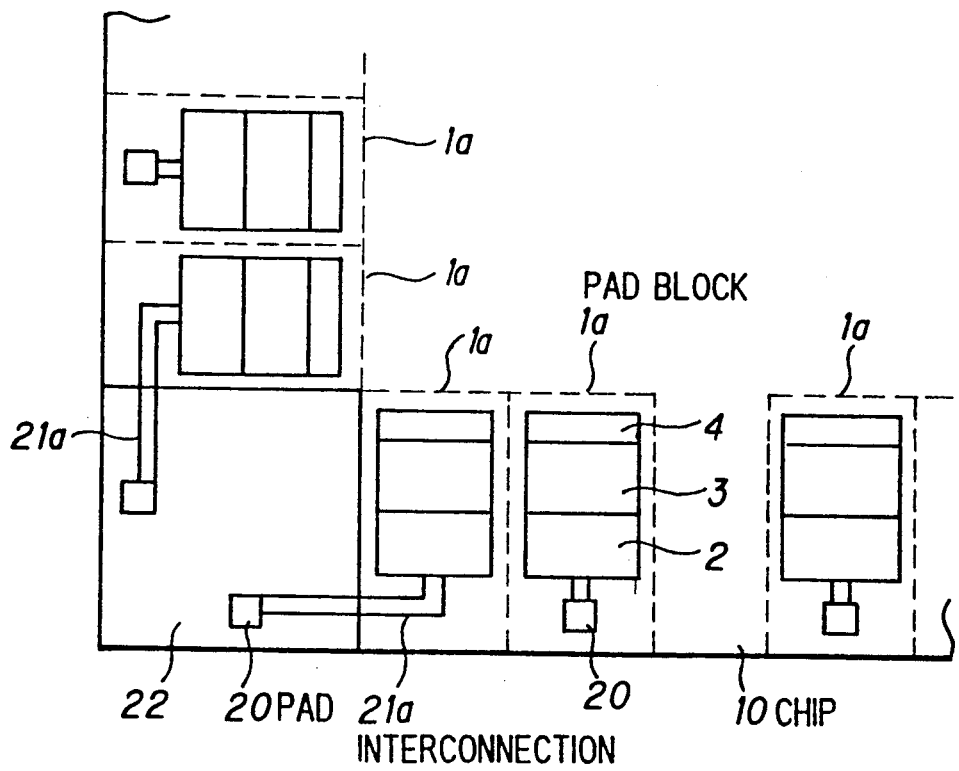
FIG. 4 is an explanatory view showing a lay-out of pad blocks manually modified in the conventional automatic design process of a semiconductor integrated circuit.

In this conventional automatic design process, the pad is required to be positioned in the pad block, so that the automatic arrangement of a pad, in which the pad is positioned in the corner block 22, is impossible to be carried out. As a result, if such a pad arrangement is required, the pad 20 is manually shifted to the corner block 22, and the shifted pad 20 is manually connected to the internal region of the original pad block 1a, after the arrangement of the original pad block, and the interconnection of the internal regions of the original pad block are finished, respectively, as shown in FIG. 4, wherein the manually modified interconnections 21a are extended to the manually shifted pads 20 in the corner block 22, respectively.

Next, a process for lay-out of a semiconductor integrated circuit of a preferred embodiment according to the invention will be explained in FIGS. 5 to 8.

Figure 5:
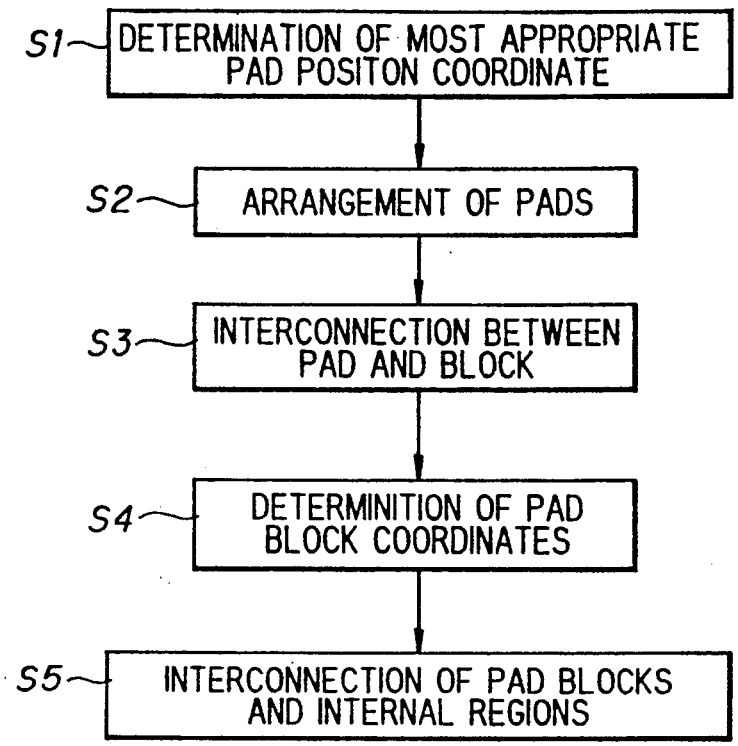
FIG. 5 is a flow chart explaining a process for lay-out of a semiconductor integrated circuit of a preferred embodiment according to the invention.
Figure 6:
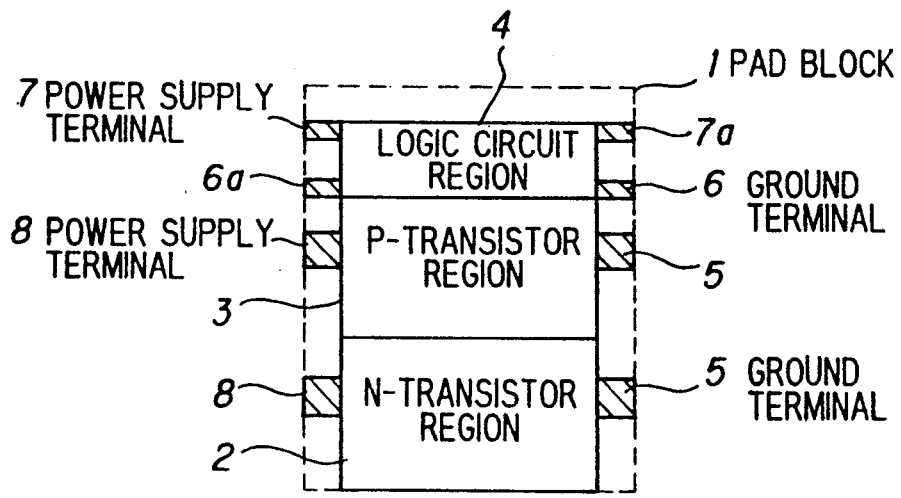
FIG. 6 is a plan view showing a pad block in the process for lay-out of a semiconductor integrated circuit of the preferred embodiment.
Figure 7:
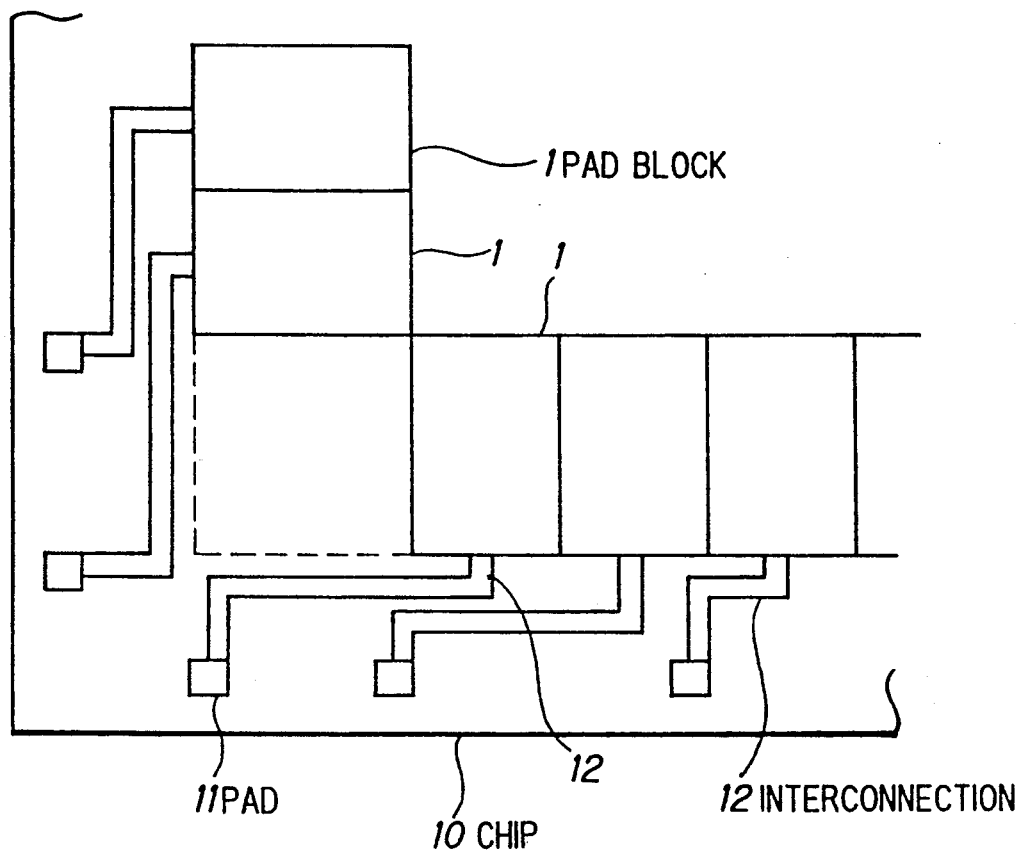
FIGS. 7 and 8 are explanatory views showing pad blocks designed in the process for lay-out of a semiconductor integrated circuit of the preferred embodiment.

FIG. 5 shows a process for lay-out of a semiconductor integrated circuit which comprises steps S1 to S5 to be applied to the design of a pad block which is shown in FIG. 6, and to the lay-out of a semiconductor chip which is shown in FIG. 7.

In FIG. 6, the pad block 1 comprises N and P channel transistor regions 2 and 3 for an output buffer circuit, and a logic circuit region 4 which is connected to the output buffer circuit, wherein the output buffer circuit and the logic circuit region 4 of the pad block 1 are connected to corresponding regions of adjacent pad blocks by ground terminals 5, 6 and 6a, and power supply terminals 7, 7a and 8.

In the process for lay-out of a semiconductor integrated circuit, a coordinate of the most appropriate pad position is determined by considering a lead frame to be used and a predicted size of a semiconductor chip (step "S1"). Next, a pad 11 is arranged at the determined coordinate (step "S2") as shown in FIG. 7, wherein pad blocks 1 are arranged along vertical and horizontal sides of the semiconductor chip 10 to be connected to the pads 11 by interconnections 12 (step "S3"). The interconnections 12 are laid out by using a first automatic lay-out (arrangement and interconnection) tool. As apparent from FIG. 7, some of the pads 11 are arranged in a region corresponding to the corner block. Then, coordinates of the pad blocks 1 are sampled to provide absolute coordinates (step "S4") and automatic lay-out of the pad blocks 1 and that of internal regions of the pad blocks 1 are carried out in accordance with the absolute coordinates thus determined by using a second automatic lay-out (arrangement and interconnection) tool (step "S5"). The reason why the first and second lay-out tools are used separately is that design rules such as the minimum interconnection width, an interconnection interval, the amount of available data, etc. are different between the interconnection of the pad 11 to the pad block 1 and that of the internal regions of the pad block 1. If the difference is negligible, the first and second automatic lay-out tools may be replaced by a common automatic lay-out tool.

As described above, the automatic lay-out process is divided into the two stages, so that the automatic lay-out process can be carried out on a whole one chip without restriction of pad position.

Figure 8:
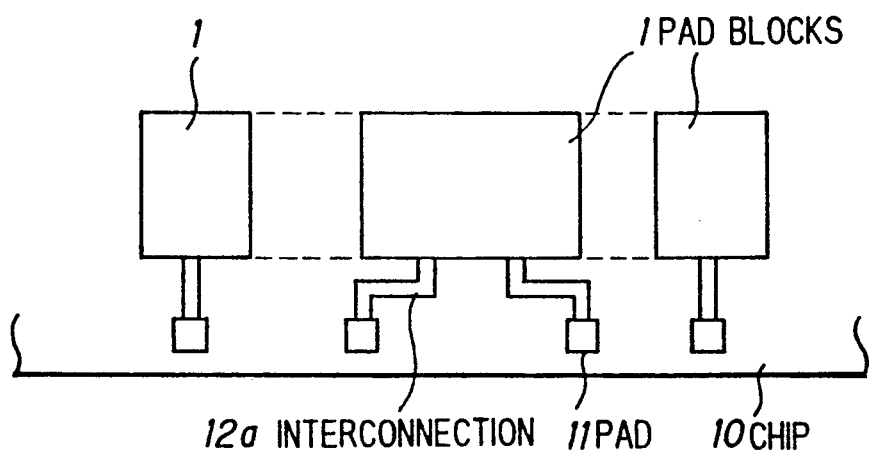

FIG. 8 shows another lay-out of pads and pad blocks designed in the process for lay-out of semiconductor integrated circuit of the preferred embodiment. As clearly understood from the arrangement, one of the pad blocks 1 is connected to two (plural) pads 11 by interconnections 12a. In such a case, however, the manual modification of pad position and interconnection thereof is required in the conventional automatic design process, even if the pad block is positioned in the center of a side of a semiconductor chip, because a pad position adaptable to a lead frame tends not to coincide with a pad position of an automatic lay-out.

As understood from the preferred embodiment, the invention is very advantageous to be applied to a mold packaged semiconductor device, because pads are positioned even at corner regions of a semiconductor chip due to the requirement of a wire bonding apparatus.

Although the invention has been described with respect to specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:

1. A process for lay-out of a semiconductor integrated circuit, comprising the steps of:
    determining a coordinate of a pad position which is most appropriate in accordance with a lead frame for packaging said semiconductor integrated circuit and a chip size of said semiconductor integrated circuit;
    arranging a pad at said coordinate;
    connecting said pad to a pad block, said pad block being positioned to be most appropriate relative to said pad;
    determining a coordinate of said pad block; and
    connecting internal regions of said pad block in accordance with said coordinate of said pad block.

2. A process for lay-out of a semiconductor integrated circuit, according to claim 1, wherein:
    said connecting of said pad to said pad block is carried out by a first automatic lay-out tool; and
    said connecting of said internal regions is carried out by a second automatic lay-out tool.

3. A process for lay-out of a semiconductor integrated circuit, according to claim 1, wherein:
    said connecting of said pad to said pad block is carried out between each of plural pads and a pad block.

4. A process for lay-out of a semiconductor integrated circuit, according to claim 1, wherein:
    said pad is arranged at a position outside of said pad block.

5. A process for lay-out of a semiconductor integrated circuit, according to claim 1, wherein:
    a plurality of pad blocks are arranged along vertical and horizontal sides of said semiconductor integrated circuit.

6. A process for lay-out of a semiconductor integrated circuit, according to claim 1, wherein:
    at least one pad is arranged in a region corresponding to a corner block.

* * * * *